United States Patent
Zhang et al.

(10) Patent No.: US 6,291,357 B1
(45) Date of Patent: Sep. 18, 2001

(54) METHOD AND APPARATUS FOR ETCHING A SUBSTRATE WITH REDUCED MICROLOADING

(75) Inventors: Luke Zhang, Santa Clara; Ruiping Wang, Fremont; Ida Ariani Adisaputro, San Jose; Kwang-Soo Kim, Mountain View, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/414,329

(22) Filed: Oct. 6, 1999

(51) Int. Cl.$^7$ .................................................... H01L 21/00
(52) U.S. Cl. ........................... 438/714; 156/345; 216/37; 216/67; 216/79; 438/719; 438/734; 438/735
(58) Field of Search ...................... 438/710, 714, 438/719, 723, 734, 735, 743; 216/2, 37, 67, 79; 156/345 P

(56) References Cited

U.S. PATENT DOCUMENTS

| | | | |
|---|---|---|---|
| 4,392,932 | 7/1983 | Harra | 204/192 E |
| 4,521,275 | 6/1985 | Purdes | 156/643 |
| 4,698,128 | 10/1987 | Berglund et al. | 156/643 |
| 4,702,795 | 10/1987 | Douglas | 156/643 |
| 4,717,448 | 1/1988 | Cox et al. | 156/643 |
| 4,902,377 | 2/1990 | Berglund et al. | 156/643 |
| 5,242,536 | 9/1993 | Schoenborn | 156/643 |
| 5,256,245 | 10/1993 | Keller et al. | 156/643 |
| 5,271,799 | 12/1993 | Langley | 156/643 |
| 5,362,526 | 11/1994 | Wang et al. | 427/573 |
| 5,384,009 | * 1/1995 | Mak et al. | 216/37 X |
| 5,591,664 | 1/1997 | Wang et al. | 437/60 |
| 5,605,600 | * 2/1997 | Muller et al. | 216/37 X |
| 5,719,089 | 2/1998 | Cherng et al. | 438/637 |
| 5,895,273 | 4/1999 | Burns et al. | 438/719 |
| 5,928,965 | * 7/1999 | Shaji et al. | 216/37 X |
| 6,051,503 | * 4/2000 | Kiron et al. | 216/37 X |

* cited by examiner

Primary Examiner—William A. Powell
(74) Attorney, Agent, or Firm—Janah and Associates

(57) ABSTRACT

A substrate 20 is placed in a process zone 115 of a process chamber 110, process gas is introduced into the process zone 115, and an energized gas is formed in the process zone 115. First process conditions are set to form etch-passivating deposits onto a surface 22 of the substrate 20. Second process conditions are set to etch the surface 22 of the substrate 20. The etch-passivating deposits formed before the etching process improve etching uniformity and reduce etch-rate microloading.

43 Claims, 4 Drawing Sheets

METHOD AND APPARATUS FOR ETCHING A SUBSTRATE WITH REDUCED MICROLOADING

BACKGROUND

The present invention relates to etching of a substrate in a plasma of process gas.

Electronic devices, such as integrated circuits, are formed by deposition, growth (such as by oxidation, nitridation, etc.) and etching of material on a substrate. In a typical etching process, a patterned etch-resistant mask is formed on the substrate by a conventional photolithographic process, and thereafter, exposed portions of the substrate are etched away with energized gases. In the etching process, a reactive gas is introduced into a chamber and is supplied with electromagnetic energy, such as microwave or radio frequency energy, to form an energized gas, such as a plasma, to etch the substrate. In addition, a biasing voltage may be applied to the plasma to energize charged plasma species to provide more anisotropic etching.

In the etching process, it is desirable to control the dimensions of the features being etched, and it also desirable to etch features, such as openings or trenches, with smooth vertical sidewalls. However, conventional etching processes often result in non-uniform etching rates and microloading effects across the substrate. Microloading is a general term used to describe undesirable variations in etch rates, feature shapes, or other etching attributes, from one etched feature to another and across the substrate. For example, the etching rates of the etched holes may vary between small diameter holes which have a high aspect ratio and large diameter holes or open spaces. As another example, the shape or etching rates of the etched features may vary from regions of the substrate having a high density of features (dense feature regions) to regions having relatively few and isolated features (isolated feature regions). Critical dimension microloading may also arise from the variations in critical dimensions of the etched features, the critical dimensions (CD) being those dimensions that are used to calculate the electrical properties of the etched features in the design of integrated circuits. For example, the cross-sectional area of an interconnect line or contact is a critical dimension that should be close to predetermined dimensions to provide the desired electrical resistance.

Accordingly, it is desirable to etch features, such as holes and interconnect lines, across the substrate at uniform and reproducible etch rates. It is further desirable to reduce variations in the etching rate of the high aspect ratio holes relative to open spaces on the substrate. It is also desirable to obtain etched features having uniform and predictable shapes.

SUMMARY

The present invention satisfies these needs. In one aspect, the present invention comprises a method of processing a substrate having a surface. In the method, the substrate is placed in the process zone and gas is introduced in the process zone and energized. First process conditions are set to form etch-passivating deposits on the surface of the substrate. Second process conditions are set to etch the surface of the substrate.

In another aspect, a method for etching a substrate comprises (i) in a plasma ignition stage, providing a gas to a process zone and capacitively coupling electromagnetic energy to the gas at an initial bias power level to form a plasma from the gas; (ii) in a plasma stabilization stage, reducing the initial bias power level to a first bias power level and inductively coupling electromagnetic energy to the plasma at a first source power level capable of stabilizing the plasma; (iii) in an etch-passivating deposit formation stage, reducing the first source power level to a second source power level and maintaining a second bias power level, thereby forming etch-passivating deposits on the substrate; and (iv) in an etching stage, increasing the second bias power level to a third bias power level, thereby etching the substrate.

In another aspect, a method of etching a substrate in a process zone comprises the steps of placing a substrate in a process zone and providing a non-reactive gas in the process zone. A plasma of the gas is formed by applying a bias power level to process electrodes in the process zone. The bias power level applied to the process electrodes is reduced while providing an etchant gas, thereby forming etch-passivating deposits on the substrate. Thereafter, the bias power level is increased to etch the substrate.

In another aspect, a method of processing a substrate comprises the steps of placing the substrate in a process zone. A gas is introduced in the process zone and energized to form a plasma. First conditions of the plasma are set to form etch-passivating deposits on the surface of the substrate. Second conditions of the plasma are set to etch the surface of the substrate.

In yet another aspect, the present invention comprises a substrate processing apparatus comprising a chamber having a support capable of receiving a substrate, a gas supply capable of introducing gas into the chamber, and a gas energizer to form a plasma of the gas. The apparatus also comprises a controller adapted to set first process conditions to form etch-passivating deposits onto a surface of the substrate, and to set second process conditions to etch the surface of the substrate.

DRAWINGS

These and other features, aspects, and advantages of the present invention will be better understood from the following drawings, description and appended claims, which illustrate exemplary features of the invention; however, it is to be understood that each of the features can be used in the invention in general, not merely in the context of the particular drawing, and the invention includes any combination of these features:

DESCRIPTION

The method and apparatus of the present invention are useful for depositing etch-passivating material on a substrate, and thereafter, etching the surface of the substrate, to reduce etch-rate microloading and providing more anisotropic etching. By "substrate" it is meant a support and overlying layers composed of semiconductor, dielectric and metal-containing or conductor materials. The substrate is typically a wafer of silicon, gallium arsenide or silica glass; the semiconductor material on the substrate may include, for example, n or p-doped regions of polysilicon or silicon; the dielectric layers may include, for example, silicon dioxide, undoped silicate glass, phosphosilicate glass (PSG), borophosphosilicate glass (BPSG), $Si_3N_4$, or TEOS deposited glass; and the metal-containing or conductor layers may include, for example, aluminum, copper, tungsten silicide or cobalt silicide.

Figure 1A:
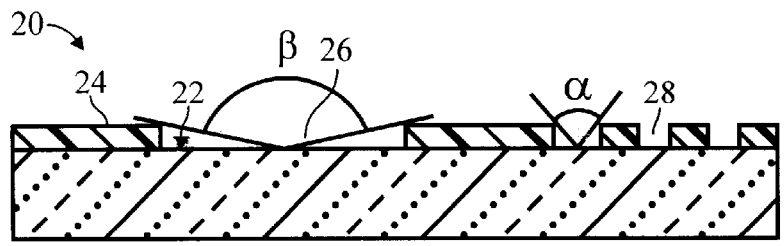
FIGS. 1a through 1c (prior art) illustrate schematic sectional side views of a substrate etched by a prior art etching method.
Figure 1B:
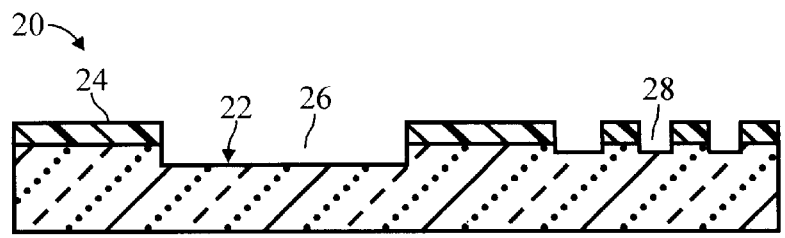
Figure 1C:
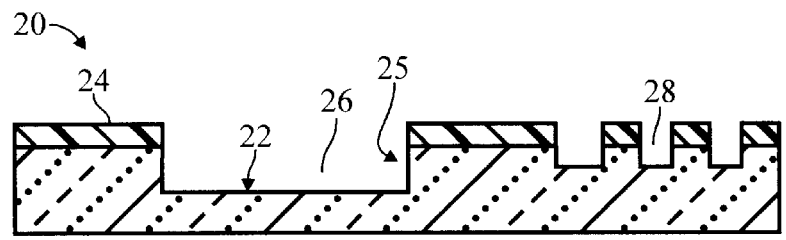

An exemplary substrate 20, as schematically illustrated in FIGS. 1a, comprises a surface 22 bearing an overlying pattern of etch-resistant features 24 comprising photoresist and/or hard mask (typically silicon oxide or silicon nitride) which are formed by conventional photolithographic methods. The etch-resistant features 24 on the surface 22 of the substrate 20 may be spaced apart from one another to expose large openings 26 of the surface of the substrate or closely spaced to expose small openings 28. The large openings 26 have a relatively large solid angle (β) as compared to the solid angle (α) of the small openings 28. It has been discovered that as the smaller openings 28 get smaller in size relative to the larger openings 26, and vice versa, conventional etching processes result in a more pronounced difference in etching rates between the larger and smaller openings, as illustrated in FIGS. 1b and 1c. It is believed that this occurs because the smaller openings 28 are approaching sizes that are sufficiently small—which may be as small as 0.35 micron or less—that the size of the opening, as determined by the solid angle (α) of the opening, becomes a limiting factor in the accessibility of etching plasma species into these openings. In contrast, the relatively large solid angle (β) of the large openings 26 provides greater accessibility of plasma species into these openings to allow a relatively larger population of plasma ions and other species to bombard the substrate 20 during the etching process. As a result, the small openings 28 are etched at slower etch rates than the large openings 26. This results in etching rate microloading in which the etched features 25 may be etched to different depths across the substrate 20, which is undesirable.

Figure 3:
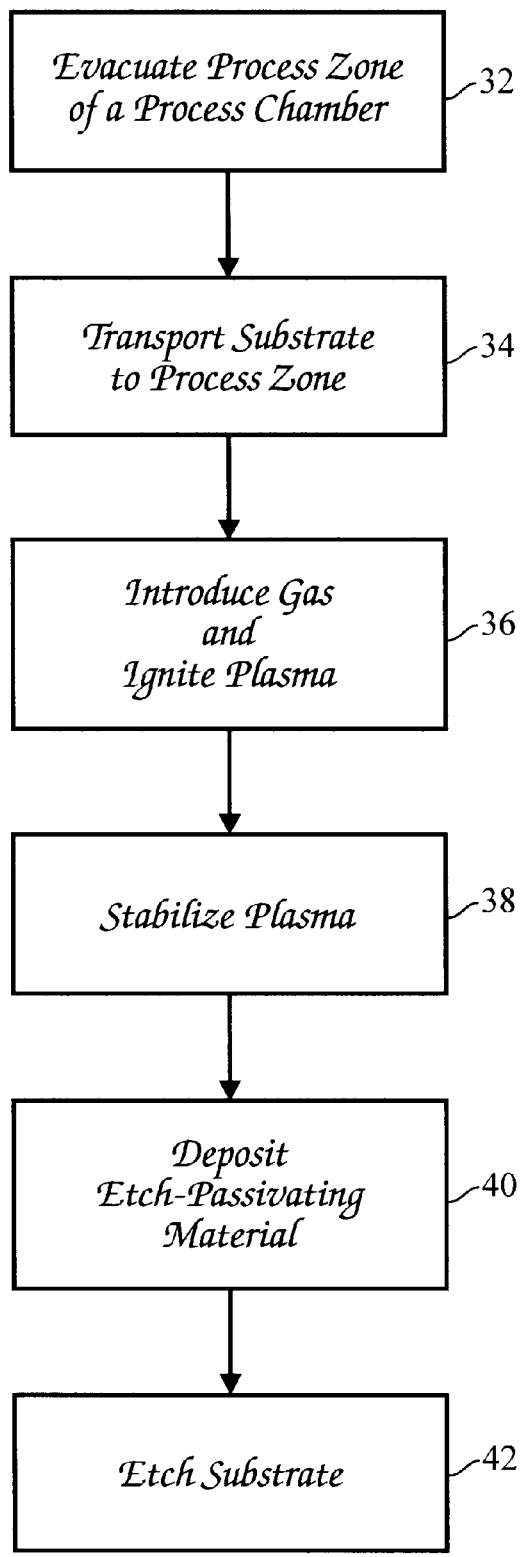
FIG. 3 is a flow chart showing the process steps in an embodiment of a method according to the principles of the present invention.

The present invention may be used to overcome these problems and provide reduced microloading effects across the substrate 20. In one embodiment, as illustrated in the flow chart of FIG. 3, multiple stages are used to initially treat or process the substrate 20 to achieve the desired etching results. These stages include initial preparatory stages 32, 34, a plasma ignition stage 36, a plasma stabilization stage 38, a deposition stage 40, and a plasma etching stage 42. Each of these stages is described below. However, it should be understood that the process may comprise fewer or additional stages, and that the stages may be combined with one another, as would be apparent to one of ordinary skill. Accordingly, the scope of the present method should not be limited to the illustrative embodiments described herein.

Figure 4:
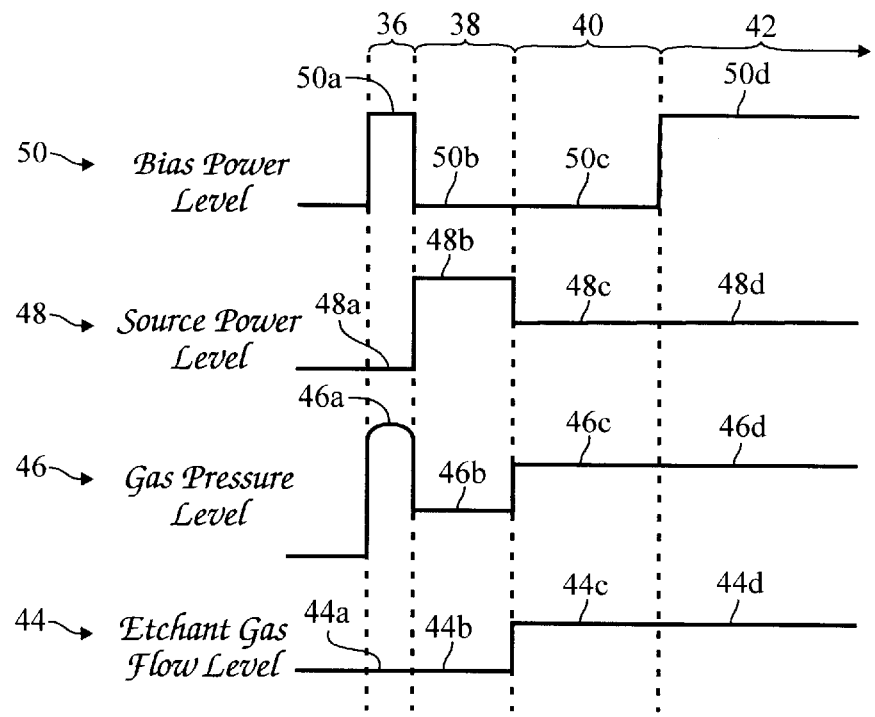
FIG. 4 is a schematic timing diagram of a set of process conditions that illustrate the method of FIG. 3.

In the initial stages 32, 34, a process zone is evacuated to a low pressure, and a substrate 20 is transported into the process zone. Referring to FIG. 4, in the initial or plasma ignition stage 36, a gas is introduced into the process zone, and a pressure 46 of the gas is set to a desired ignition pressure level 46a. For plasma ignition, the ignition gas pressure level 46a is typically from about 50 to about 200 mTorr. The gas is suitable for igniting the plasma and is typically a non-reactive gas, such as argon, and may also include a reactive gas, such as an etchant gas that is used to process the substrate 20. The non-reactive gas may be used to form or stabilize the initial plasma state before the etchant gas is introduced into the pre-energized plasma. The gas in the process zone is energized to a plasma state by capacitively or inductively coupling electromagnetic energy to the gas. For example, the plasma may be ignited by capacitively coupling energy to the gas by applying a bias voltage at an initial or plasma ignition bias power level 50 to process electrodes in the process zone. The ignition bias power level 50 may be controlled by the voltage applied across electrodes located above, around, and/or below the substrate 20. Generally, the initial or ignition bias power level 50a is at least about 150 Watts, and more typically from about 150 to about 500 Watts. In this stage, the source power level 48a is typically set to a low ignition source level 48a which may be zero. Also, typically, the etchant gas flow level 44a is typically zero, but etchant gas may be introduced at this stage. The high bias power level is maintained for a short time of a few seconds to ignite the plasma.

In the plasma stabilization stage 38, a higher source power level 48b of electromagnetic energy is inductively coupled to the energized gas in the process zone while the bias power 50 is maintained at a lower stabilization level 50b, which may include turning off the bias power level altogether. The source power level 48b controls the inductively coupled power applied to the energized gas to stabilize and sustain the plasma, and it is the power level of the current applied to an antenna disposed about the process chamber. The inductively coupled RF energy supplied from the antenna is used to stabilize and maintain a plasma in the process chamber, and the level of stabilization source power can also effect the reactivity of the plasma. During this stage, the stabilization source power level 48b is typically set to between about 2000 and about 4000, and more preferably 2000 Watts. In addition, the gas pressure 46 is reduced to a lower level 46b in the mTorr range, for example, about 10 to about 30 mTorr. The etchant gas 44 is held at a flow level 44b of zero.

Figure 2A:
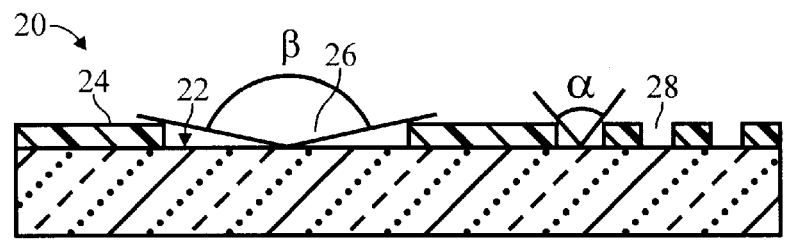
FIGS. 2a through 2c illustrate schematic sectional side views of a substrate etched by a method according to the present invention.
Figure 2B:
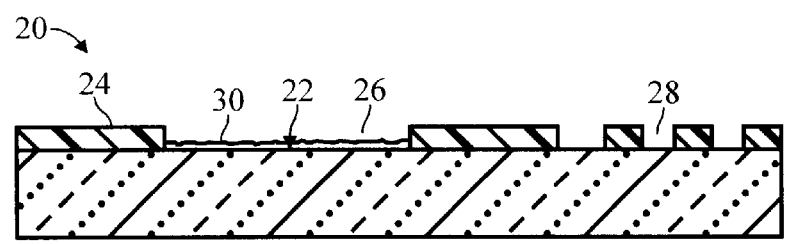
Figure 2C:
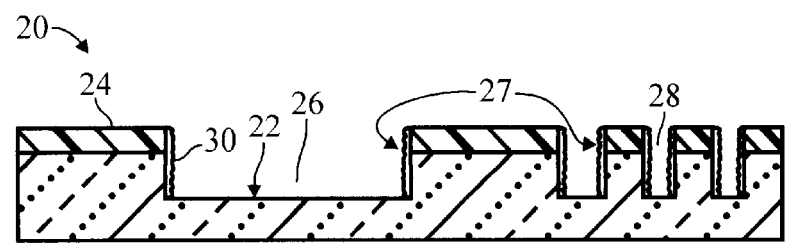

Thereafter, in a deposition stage 40, the process conditions of the energized gas are set to form deposits 30 from the energized gas onto the surface 22 of the substrate 20, as illustrated in FIGS. 2a through 2c. The deposits 30 may be composed of etch-passivating material that provides some resistance to etching by the etchant gas. The etch-passivating deposits 30 typically contain a fluoropolymer comprising fluorine and carbon species. Alternatively, the deposits 30 may comprise other materials, including materials that remain on the substrate 20 after processing and may also comprise materials that are used to form various layers on the substrate 20, such as for example, dielectric, semiconductor, metal or conductor, or other materials.

The etch-passivating deposits 30 that are formed on the surface 22 of the substrate 20 slow down the rate of etching at those portions of the substrate 20, thereby provide etched features 27 having sidewalls which are more perpendicular and less tapered, i.e., with enhanced anisotropic etching, as schematically shown in FIG. 2c. Preferably, thicker deposits 30 are formed in the larger sized openings 26 (as shown in FIG. 2b), which causes the exposed surfaces 22 of the substrate 20 within the larger openings 26 to be etched slower than the exposed substrate 20 in the smaller openings 28. This compensates for the higher etch rates obtained in the larger openings 26 that occurred in prior art etching processes. As a result, low etch-rate microloading is obtained in which the depth of the etched features 27 do not significantly change, whether in an isolated region of the substrate 20 which has few features 27 with large openings 26 or in a dense region of the substrate 20 which has a large number of features 27 with smaller openings 28. By forcing increased deposition of etch-passivating material in the large openings 26 of the substrate 20, the etching microloading effects upon completion of the etch process were found to be significantly reduced. Accordingly, the substrate 20 is etched more uniformly and with reduced etch-rate microloading.

To form the etch-passivating deposits 30, gas that is capable of forming passivating deposits is introduced into the process zone in the deposition stage. In general, these deposits may be formed by the gaseous species reacting with itself or other reactive species in the plasma, such as gaseous species originating from the material on the substrate 20. The gas that forms the etch-passivating deposits 30 may also be capable of etching the substrate 20, i.e., the gas may also comprise the etchant gas. Good control of microloading is obtained when the reactant gas contains a fluorocarbon gas such as $CF_4$, $C_2F_6$, $CHF_3$, $CH_2F_2$, and $CH_3F$, which may also serve as the etchant gas for etching through a silicon-containing material. In the stage 40, the etchant gas flow 44 is typically increased to from about 2 to about 500 sccm. For example, the gas may comprise (i) about 20 to about 60 sccm $CHF_3$ and about 100 to about 300 sccm argon, or (b) about 2 to about 250 sccm $C_2F_6$, and more preferably, 20 to 50 sccm $C_2F_6$; about 1 to about 150 $C_2H_2F_2$, and more preferably, 20 to 50 sccm $CH_2F_2$; and about 10 to about 1500 sccm argon, and more preferably, 50 to 200 sccm argon. The gas pressure 46 is typically set to a deposition pressure level 46c which is higher than the stabilization pressure level 46b, but lower than the ignition pressure level 46a, such as for example, from about 10 to about 100 mTorr.

In addition, the bias power level 50 is maintained at a deposition bias power level 50c that is sufficiently low to allow etch passivating deposits 30 to form on the substrate 20. The deposition bias power level 50c at which etch-passivating deposits 30 are formed depends on the other process conditions such as the composition and pressure of the gas, the source power level 48, and the temperature of the substrate 20. Increasing the deposition bias power level 50c increases the energy of the plasma ions impacting the surface 22 of the substrate 20 and reduces the thickness of the etch-passivating deposits 30 formed on the substrate 20. Reducing the deposition bias power level 50c reduces the rate of removal of the etch-passivating deposits 30, especially in the large openings 26 of the substrate 20 that have few features. In one version, the deposition bias power level 50c is maintained at less than about 100 Watts, and more preferably from about 10 to about 50 Watts. The bias power level 50c may also be desirably reduced to a zero level by shutting off the voltage applied to the process electrodes and letting both electrodes float at the chamber potential. Typically, the deposition bias power level 50c is maintained at a reduced level for about 2 to about 24 seconds, and more typically for about 8 to about 16 seconds. Generally, it is desirable to apply a voltage to the electrode monotonically, i.e., by maintaining a bias power level over the entire electrode surface, rather than, for example, only on a portion of the electrode. The uniform voltage across the entire electrode below the substrate 20 uniformly energizes the plasma ions above the substrate 20. During the deposition stage 40, the source power level 48 is also reduced to a lower deposition level 48c than that used in the earlier plasma stabilization stage 38, and is typically from about 800 to about 2000 Watts.

After formation of the etch-passivating deposits 30, the substrate 20 is etched in an etching process stage 42. In the etching stage 42, additional etchant gas may be introduced into the process zone, or the etchant gas may be the same gas as that used to ignite the plasma. The composition of the etchant gas depends upon the composition of the material to be etched. For example, in the etching of silicon-containing materials—such as for example, silicon, polysilicon, or silicon dioxide—the etchant gas often comprises a fluorine-containing gas such as a fluorocarbon gas such as $CF_4$, $C_2F_6$, $CHF_3$, $CH_2F_2$, and $CH_3F$. During the etching stage 42, the flow rate 44b of etchant gas is typically from about 10 to about 100 sccm. The gas pressure 46 is set to the same or a different level 46d than that of the earlier stage, such as for example, from about 5 to about 100 mTorr. After the gas composition has stabilized, the process conditions of the energized gas are set to etch the surface 22 of the substrate 20.

In the etching stage 42, the bias power level 50 is increased to an etching bias power level 50d which is higher than the previous deposition bias power level 50c in the deposition stage 40. The higher etching bias power level 50d provides anisotropic etching of the substrate 20. Preferably, the etching bias power level 50d is maintained at a sufficiently low level to allow formation of some etch-passivating deposits 30 on the substrate 20 during the etch process. These deposits 30 protect the sidewalls of the etched features 27 from being excessively etched in the horizontal direction, thereby providing anisotropic etching with vertical and non-tapered sidewalls. Typically, the etching bias power level 50d is set to from about 800 to about 1600 Watts. In addition, the source power 48 is maintained at an etching source power level 48d that is lower than the stabilization source power level 48c, and is typically from about 800 to about 2000 Watts. The etching stage 42 is typically conducted for about 0.5 to about 10 minutes, and more preferably from about 2 to about 3 minutes.

The process of the present invention allows etching of a substrate 20 with etch-rate microloading of less than about 15%, often less than 10%, and sometimes less than 5%. These are significantly improved microloading results. In addition, it should be further noted that the etching step is conducted in the same process zone as that in which the etch-passivating deposits were formed. In contrast, prior art chambers typically deposit and etch material in different process zones and in different process chambers. Although multiple chambers may be utilized to conduct the process of the present invention, it is often faster to utilize a single process chamber to conduct each stage of the process because the substrate does not have to be moved from one chamber to another at each process stage.

Figure 5:
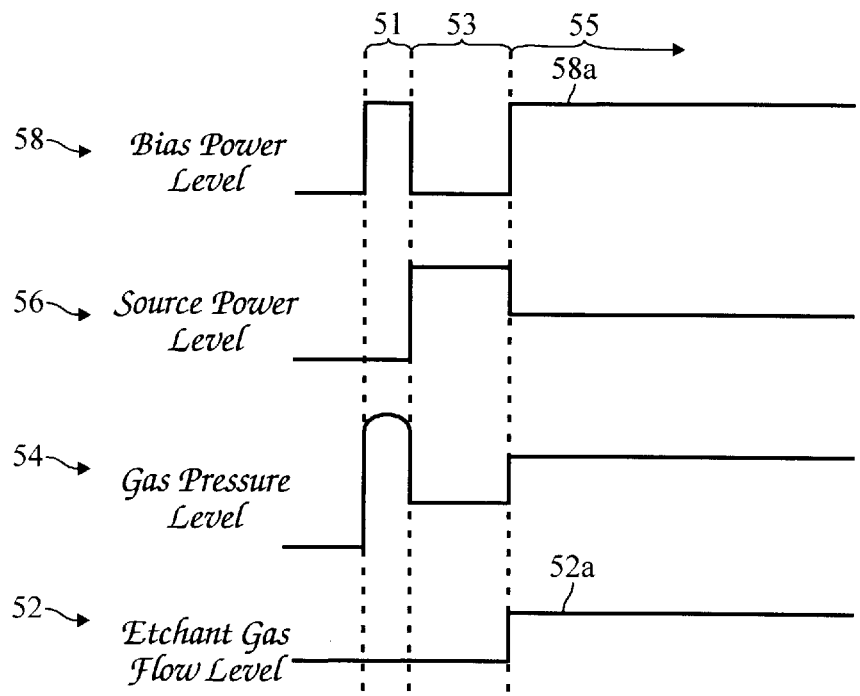
FIG. 5 (prior art) is a schematic timing diagram of process conditions used in a typical prior art process.
Figure 6:
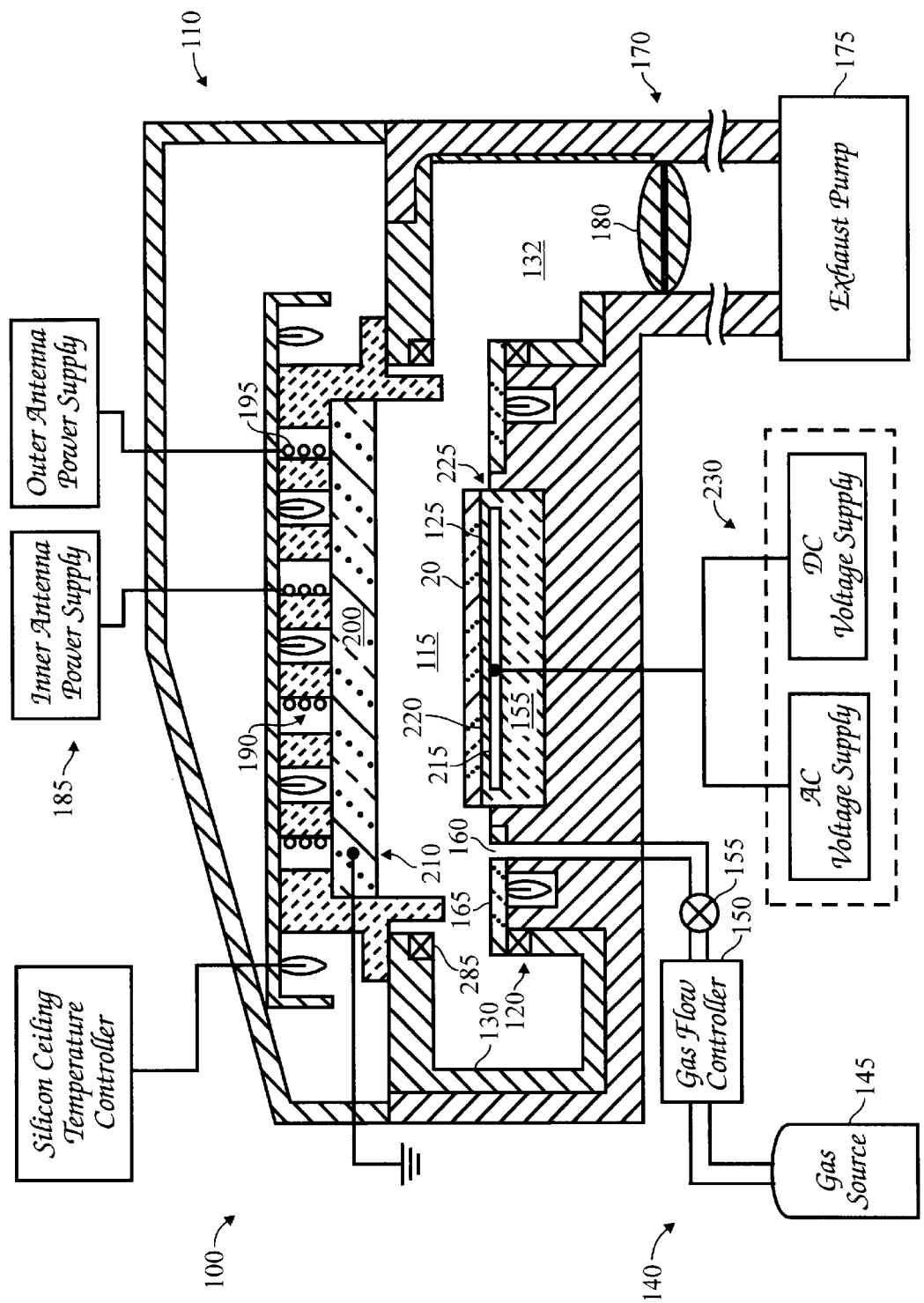
FIG. 6 is a schematic illustration of an embodiment of a process chamber useful for practicing the present invention.

As a comparative example, FIG. 5 shows a schematic of a process condition timing diagram of a prior art etching process. In the prior art etching process, the bias power 58 was increased to a higher level 58a at the same time as when the etchant gas flow 52a was started in the etching stage 55. There is no deposition stage, and instead, the prior art process comprises a plasma ignition stage 51, a plasma stabilization stage 53, and an etching stage 55. It was discovered that the increased bias power level 58a reduced the formation of the etch-passivating deposits 30 on the substrate 20 during the etching stage. It is believed that the high bias power level 58a energize the plasma ions, causing the plasma ions to energetically bombard the substrate 20, thus preventing the etch-passivating deposits from forming on the substrate 20. It was further discovered that in the large openings 26 of the substrate 20, the removal of the etch-passivating deposits by the energetic plasma was even more pronounced than in the smaller openings 28. This resulted in little or no formation of etch-passivating deposits in the larger openings 26 of the substrate 20 relative to the smaller openings 28. As a result, during the subsequent etching process, large etch-rate microloading effects were observed with differences in etch rate of up to 20% between the large openings 26 and the small openings 28. These microloading effects were reduced to negligible levels by the method and apparatus of the present invention.

EXAMPLES

The following examples illustrate use of the present invention for etching of a substrate in a plasma of process gas. However, the apparatus and method can be used in other applications as would be apparent to those skilled in the art, and the scope of the present invention should not be limited to the illustrative examples provided herein.

In these examples, substrates were processed in an IPS chamber, schematically illustrated in FIG. 4, and commercially available from Applied Materials Inc., Santa Clara, Calif. The apparatus 100 comprises an enclosed process chamber 110 defining a process zone 115 for processing the substrate 20, and a support 120 having a receiving surface 125 for holding the substrate 20 during processing. A load-lock transfer area (not shown) is maintained at low pressure for holding a cassette of substrates. The enclosed chamber 110 has walls 130 fabricated from a metal, ceramic, glass, polymer, or composite material, and which may have a surrounding liner. The process zone 115 of the etching chamber is above and around the substrate 20 and typically comprises a volume of at least about 10,000 cm$^3$, and more typically from about 10,000 to about 50,000 cm$^3$. The particular embodiment of the apparatus 100 shown herein is suitable for processing of semiconductor substrates, is provided only to illustrate the invention, and should not be used to limit the scope of the invention.

Process gas is introduced into the chamber 110 by a gas supply 140 that includes a gas source 145 and a gas flow controller 150 that regulates the gas flow through one or more gas flow control valves 155. The gas is provided in the chamber 110 via gas nozzles 160 located at or around the periphery of the substrate 20 (as shown), or which may be provided in a showerhead on the ceiling of the chamber (not shown). Preferably, the gas is introduced through a ring 165 that is maintained at a temperature of from about 250° C. to about 400° C. Spent process gas and etchant byproducts are exhausted from the process chamber 110 through an exhaust system 170 (typically including roughing and high vacuum-type exhaust pumps 175) capable of achieving a minimum pressure of about 10$^{-3}$ mTorr in the chamber 110. A throttle valve 180 is provided in the exhaust to control the flow of spent process gas and the pressure of process gas in the chamber 110.

A plasma may be generated from the process gas introduced into the chamber 110 using a plasma generator 185 that couples an electromagnetic energy into the gas in the process zone 65 of the chamber 55. A suitable plasma generator 185 comprises an antenna 190 adjacent to the ceiling 200 consisting of one or more coils 195 having a circular symmetry with a central axis coincident with the longitudinal vertical axis that extends through the process chamber 110. The ceiling 200 is of material which admits electromagnetic fields generated by the antenna 190 into the process zone 65. This material may be a dielectric or as described below a semiconductor. The frequency of the RF voltage applied to the antenna 190 is typically from about 50 KHz to about 60 MHz, and more typically about 2 MHz, and the power level of RF voltage applied to the antenna 190 is typically from about 100 to about 5000 Watts.

Instead, or in addition to the antenna 190, the plasma generator 185 may comprise one or more process electrodes 210, 215 that may be used to accelerate or energize the plasma ions in the chamber 110. For example, the process electrodes may include a first electrode 210 comprising a wall of the process chamber, such as the ceiling 200 of the chamber. The first electrode 210 is capacitively coupled to a second electrode 215 in the support 120 below the substrate 20. The second electrode 215 is fabricated from a metal such as tungsten, tantalum, or molybdenum, and may be covered by or embedded in a dielectric 220. The second electrode 215 may serve as an electrostatic chuck 225 that generates an electrostatic charge for electrostatically holding the substrate 20 to the receiving surface 125 of the support. A heater or cooler (not shown) may also be provided below the dielectric 220 to heat or cool the overlying substrate 20 to suitable temperatures.

In a preferred embodiment, the first electrode 210 comprises a semiconductor ceiling 200 that is sufficiently electrically conductive to be biased or grounded to form an electric field in the chamber 110 yet provides low impedance to an RF induction field transmitted by the antenna 190 above the ceiling 200. Many well-known semiconductor materials can be employed, such as silicon carbide, germanium, or Group III-V compound semiconductors such as gallium arsenide and indium phosphide, or Group II-III-V compound semiconductors such as mercury-cadmium-telluride. However, a ceiling comprising silicon is preferred since it is less likely to be a source of contamination for processing silicon substrates, in comparison with other materials. More preferably, the semiconductor ceiling 200 comprises semiconducting silicon having a resistivity of less than about 500 Ω-cm (at room temperature), and most preferably about 20 Ω-cm to about 200 Ω-cm. The temperature of the ceiling is typically maintained at from about 120° C. to about 200° C., and often above about 300° C.

The first and second electrodes 210, 215 are electrically biased relative to one another by the electrode voltage supply 230 that includes an AC voltage supply for providing a plasma generating RF voltage to the second electrode 215, and a DC voltage supply for providing a chucking voltage to the second electrode 215. The AC voltage supply provides an RF generating voltage having one or more frequencies from 50 KHz to 60 MHz, and preferably about 2 MHz. The power level of the RF bias current applied to the electrodes 200, 215 is typically from about 50 to about 3000 Watts. When the second electrode 215 also serves as an electrostatic chuck, a separate DC voltage is applied to the electrode 215 to form an electrostatic charge that holds the substrate 20 to the chuck. The RF power is coupled to a bridge circuit and an electrical filter to provide DC chucking power to the electrode 215.

Typically, the apparatus 100 is operated by one or more controllers (not shown) that include instructions to set first process conditions to form etch-passivating deposits onto a surface of the substrate, and set second process conditions to etch the surface of the substrate. Typically, the controller comprises a computer operating a computer program containing program code embodying the process conditions. For example, the program code may comprise computer instructions to lower a bias power applied to the process electrodes after a plasma of the gas is stabilized, to set a bias power of substantially zero, or to maintain a bias power at a predetermined level and for a preset time. In addition, the program code may comprise computer instructions to maintain a flow of a gas capable of forming etch-passivating deposits on the substrate or etching the substrate, control a source power level applied to an inductor source about the process zone, or change a bias power level to another bias power level.

In the example, substrates 20 comprising silicon wafers having a pattern of etch-resistant features 24 thereon were processed. The patterned etch-resistant features; 24 included trenches with small openings 28 sized about 0.5 micrometers ($\mu$m) and trenches with large openings 26 sized about 5 $\mu$m, which is about ten times higher.

The chamber 110 was initially pumped down to a pressure of about $10^{-4}$ Torr, and argon gas at a flow rate of 200 sccm was introduced into the chamber 110. The pressure of the gas was stabilized at about 50 mTorr. The temperature of the second electrode 215 was held at about $-10°$ C., the temperature of the ceiling 200 maintained at about 140° C., and the temperature of the ring 165 at about 270° C.

In the plasma ignition stage, a plasma was ignited from the gas by applying an RF bias voltage at an ignition bias power level of 370 Watts to the process electrodes 210, 215 in the chamber 110. In the plasma stabilization stage, the bias power level was turned off, and a source power level of 1200 Watts was applied to the antenna 190 to sustain the plasma by an inductive energy. Thereafter, the plasma was stabilized for 10 seconds.

In the etch-passivation deposit stage, a gas composition of 25 sccm $C_2F_6$/15 sccm $CH_2F_2$/150 sccm Ar was introduced into the chamber 110, and a pressure of 60 mTorr was maintained. The source power was reduced to 1000 Watts.

The deposition stage was operated for time intervals of 0, 8, or 16 seconds. Thereafter, the substrates 20 were etched in an etching stage, the bias power level to the electrodes 210, 215 was turned up to a higher level of about 800 Watts, while the source power was maintained at 1000 Watts. Each substrate 20 was etched for 150 seconds. By varying the amount of time that a substrate 20 was exposed to the fluorocarbon-containing plasma in the absence of an applied bias voltage, the effects of the etch-passivating deposits on the subsequent etching process were evaluated.

In the first example, the deposition stage was not used, and instead the bias power was turned on at the same time as the etchant gas was introduced as with a conventional prior art process. After etching, the substrates 20 were cut, and cross-sections of the etched openings were examined by scanning electron microscopy (SEM). The SEM microphotographs showed an etch depth of 1.9 $\mu$m in the small openings 28 as compared with an etch depth of 2.27 $\mu$m in the large openings 26. This evidenced a microloading effect ($\mu_D$) of about 16% between the small and large openings, as determined from:

$$\mu_o = \frac{E_o \text{ open area} - E_c \text{ contact hole}}{E_o \text{ open area}} \times 100\%$$

where $E_o$ open area is the etch depth obtained in features having large openings 26, and $E_c$ contact is the etch depth obtained in features having small openings 28.

In the second example, the deposition stage was operated for 8 seconds after the etchant gas was introduced. The SEM micrographs of the etched substrates showed an etch depth of 2.43 $\mu$m in the small openings 28 as compared with an etch depth of 2.8 $\mu$m in the large openings 26. This demonstrated a reduced microloading of about 13% which was about 25% less than the microloading obtained in the first example.

In the third example, the deposition stage was operated for about 16 seconds after the etchant gas was introduced. The microphotographs showed an etch depth of 2.55 $\mu$m in the small openings 28 as compared with an etch depth of 2.6 $\mu$m in the large openings 26. Thus microloading of less than 5% was obtained. The close to 60% improvement in microloading over the non-deposition prior art process was an unexpected and surprising result.

The present invention has been described with reference to certain preferred versions thereof; however, other versions are possible. For example, the invention has been described with reference to a preferred etching process and chamber. However, the inventive processes can be applied in other process chambers as would be apparent to one of ordinary skill, including without limitation, CVD and PVD process chambers. Therefore, the spirit and scope of the appended claims should not be limited to the description of the preferred versions contained herein.

What is claimed is:

1. A method of processing a substrate in a process zone, the method comprising the steps of:

placing the substrate in the process zone, the substrate having a surface;

introducing a gas in the process zone and energizing the gas;

setting first process conditions to form etch-passivating deposits on the surface of the substrate; and setting second process conditions to etch the surface of the substrate.

2. A method according to claim 1 wherein the second process conditions are set after the first process conditions.

3. A method according to claim 1 wherein first process conditions are set for a sufficient time to form etch-passivating deposits in small openings on the surface of the substrate.

4. A method according to claim 1 wherein the step of setting the first process conditions comprises lowering a bias power level applied to process electrodes in the process zone while maintaining a flow of gas capable of forming the etch-passivating deposits.

5. A method according to claim 4 comprising lowering the first bias power level by at most about 200 Watts.

6. A method according to claim 4 comprising lowering the first bias power level to substantially zero.

7. A method according to claim 4 comprising maintaining a flow of etchant gas.

8. A method according to claim 4 comprising energizing the gas by applying a bias power to the process electrodes at a plasma ignition level.

9. A method according to claim 4 comprising lowering a source power level applied to an inductor antenna about the process zone.

10. A method according to claim 4 wherein setting the second process conditions comprises increasing the bias power level.

11. A method according to claim 4 comprising the step of maintaining the first bias power level for about 0 to about 16 seconds.

12. A method according to claim 1 wherein the first and second process conditions are selected to reduce etch-rate microloading to less than about 10%.

13. A method according to claim 1 wherein the process zone is in a single process chamber.

14. A method according to claim 1 wherein the gas comprises a non-reactive gas.

15. A method according to claim 1 wherein the gas comprises a fluorocarbon gas.

16. A method according to claim 15 wherein the fluorocarbon gas comprises one or more of $CF_4$, $C_2F_6$, $CH_2F_2$, $CH_3F$, and $CHF_3$.

17. A method of etching a substrate, the method comprising the steps of:
   placing a substrate in a process zone;
   in a plasma formation stage, providing a gas to a process zone and forming a plasma;
   setting a plasma power level to forming etch-passivating deposits on the substrate; and
   setting a plasma power level to etch the substrate.

18. A method according to claim 17 wherein the plasma formation stage comprises a plasma ignition stage and a plasma stabilization stage.

19. A method according to claim 18 wherein the plasma ignition stage comprises the step of capacitively coupling electromagnetic energy to the gas at a plasma ignition bias level.

20. A method according to claim 19 wherein the plasma stabilization stage comprises the step of reducing the plasma ignition bias level to a first bias power level, and inductively coupling electromagnetic energy to the plasma at a first source power level.

21. A method according to claim 20 wherein the step of setting the plasma power level to forming etch-passivating deposits comprises reducing the first source power level to a second source power level and maintaining a second bias power level.

22. A method according to claim 21 wherein the step of setting a plasma power level to etch the substrate comprises increasing the second bias power level to a third bias power level.

23. A method of etching a substrate in a process zone, the method comprising the steps of:
   (a) placing a substrate in a process zone,
   (b) providing a non-reactive gas in the process zone;
   (c) forming a plasma of the gas by applying a bias power level to process electrodes in the process zone;
   (d) reducing the bias power level applied to the process electrodes while providing an etchant gas, thereby forming etch-passivating deposits on the substrate; and
   (e) increasing the bias power level to etch the substrate.

24. A substrate processing apparatus comprising:
   a process chamber having a support capable of receiving a substrate;
   a gas supply capable of introducing gas into the process chamber;
   a gas energizer to form a plasma of the gas; and
   a controller adapted to set first process conditions to form etch-passivating deposits onto a surface of the substrate, and to set second process conditions to etch the surface of the substrate.

25. An apparatus according to claim 24 wherein the controller comprises a computer capable of operating a computer program containing program code embodying the first and second process conditions.

26. An apparatus according to claim 25 wherein the program code embodying the first process conditions comprises instructions to lower a first bias power level applied to process electrodes.

27. An apparatus according to claim 25 wherein the program code embodying the first process conditions comprises instructions to apply a first bias power level of at most about 200 Watts.

28. An apparatus according to claim 24 wherein the program code embodying the first process conditions comprises instructions to set a first bias power level of substantially zero.

29. An apparatus according to claim 24 wherein the program code embodying the first process conditions comprises instructions to maintain a flow of a gas capable of forming the etch-passivating deposits.

30. An apparatus according to claim 24 wherein the program code embodying the first process conditions comprises computer instructions to lower a source power level applied to an inductor antenna about the process zone.

31. An apparatus according to claim 24 wherein the program code embodying the first process conditions comprises instructions to change the first bias power level to a second bias power level that is higher than the first bias power level.

32. An apparatus according to claim 24 wherein the program code embodying the first process conditions comprises instructions to maintain the first bias power level for about 0 to about 16 seconds.

33. A method of processing a substrate in a process zone, the method comprising the steps of:
   placing the substrate in the process zone, the substrate having a surface;
   introducing a gas in the process zone and energizing the gas to form a plasma;
   setting first conditions of the plasma to form etch-passivating deposits on the surface of the substrate; and
   setting second conditions of the plasma to etch the surface of the substrate.

34. A method according to claim 33 wherein the second conditions are set after the first conditions.

35. A method according to claim 33 wherein first conditions are set for a sufficient time to form etch-passivating deposits in small openings on the surface of the substrate.

36. A method according to claim 33 wherein setting the first conditions comprise lowering a bias power level applied to electrodes in the process zone.

37. A method according to claim 36 comprising lowering the first bias power level by at most about 200 Watts.

38. A method according to claim 36 comprising lowering the first bias power level to substantially zero.

39. A method according to claim 36 wherein the bias power level is maintained for about 0 to about 16 seconds.

40. A method according to claim 36 wherein setting the second conditions comprises increasing the bias power level.

41. A method according to claim 36 wherein the first and second conditions are selected to reduce etch-rate microloading to less than about 10%.

42. A method according to claim 33 wherein the process zone is in a single chamber.

43. A method according to claim 33 wherein the gas comprises a fluorocarbon gas.

* * * * *